United States Patent [19]
Kuth

[11] Patent Number: 5,627,470
[45] Date of Patent: May 6, 1997

[54] MAGNETIC RESONANCE APPARATUS WITH AN ILLUMINATION MEANS

[75] Inventor: Rainer Kuth, Herzogenaurach, Germany

[73] Assignee: Siemens Aktiengesellschaft, Munich, Germany

[21] Appl. No.: 554,358

[22] Filed: Nov. 6, 1995

[30] Foreign Application Priority Data

Nov. 10, 1994 [DE] Germany ............... 44 40 226.0

[51] Int. Cl.$^6$ ................................................. G01V 3/00
[52] U.S. Cl. .............................................. 324/318; 324/322
[58] Field of Search ............................. 324/318, 322, 324/319, 320, 307, 309, 300; 128/653.5

[56] References Cited

U.S. PATENT DOCUMENTS

| 3,433,940 | 3/1969 | Baez et al. | |
|---|---|---|---|
| 4,629,989 | 12/1986 | Riehl et al. | 324/318 |
| 4,901,141 | 2/1990 | Costello | 324/318 |
| 5,150,710 | 9/1992 | Hall et al. | 324/318 |

FOREIGN PATENT DOCUMENTS

| OS2603513 | 8/1977 | Germany. |
|---|---|---|
| 9101720 U | 6/1991 | Germany. |
| PS4225433 | 10/1994 | Germany. |
| 1149588 | 4/1969 | United Kingdom. |

*Primary Examiner*—Louis M. Arana
*Attorney, Agent, or Firm*—Hill, Steadman & Simpson

[57] ABSTRACT

In a magnetic resonance apparatus having vertically spaced pole shoes with an examination space therebetween and with an illumination system for illuminating at least a part of an examination space, the illumination system includes a light source arranged outside the examination space and a lightguide having a first end optically coupled to the light source. The lightguide extends above the examination space up to a symmetry line of the examination space. Deflection optics are optically coupled to a second end of the lightguide that lies opposite the light source. The deflection optics deflects the light rays emerging from the second end downwardly in a vertical direction. The lightguide is formed by a bundle of optical fibers which are arranged side-by-side in a flat arrangement on the upper pole shoe so as to reduce the height of the examination space only insignificantly.

6 Claims, 1 Drawing Sheet

MAGNETIC RESONANCE APPARATUS WITH AN ILLUMINATION MEANS

BACKGROUND OF THE INVENTION

1. Field of the Invention

The invention is directed to a magnetic resonance apparatus with an illumination means for illuminating at least a part of an examination space.

2. Description of the Prior Art

German OS 42 25 433 discloses a magnetic resonance apparatus having illumination means in the form of a light source arranged outside the examination space and a lightguide arrangement extending into the examination space, the lightguide arrangement having a first end optically coupled to the light source. The examination space located inside a measurement tunnel is diffusely illuminated by this illumination means in order to reduce anxiety on the part of patients. To that end, a light source, whose light is supplied into a lightguide arrangement via an optical connector, is arranged outside the examination space. The lightguide arrangement is composed of individual optical fibers that have curvatures inside the measurement tunnel. A part of the infed light emerges at each curvature and illuminates the inside of the measurement tunnel. The illumination means, however, is not suitable for making available the high luminance required for surgical procedures.

German Utility Model G 91 01 720.3 discloses a cold-light lamp that, in particular, can be used in the medical field. The cold-light lamp has a lamp housing to which a cable-shaped light waveguide can be connected. This cold-light lamp could be utilized in conjunction with magnetic resonance examinations, but if it were fixed in place in the magnetic resonance apparatus, it would require additional space in what is already a tight examination space. Since the size of the examination space determines the structural and operational specifications of the magnetic and radiofrequency components, the installation of such a conventional cold-light lamp would increase the performance demands made of the components of the magnetic resonance apparatus.

SUMMARY OF THE INVENTION

It is an object of the present invention to provide a magnetic resonance apparatus with an illumination means that makes adequately high luminance for surgical procedures available, but which only insignificantly reduces the structural height of the examination space.

This object is achieved in a magnetic resonance apparatus wherein the examination space is arranged between two pole shoes disposed vertically spaced from and opposite one another, with a lightguide arrangement extending along a surface of the upper pole shoe up to a symmetry line of the examination space, with optical fibers of the lightguide arrangement being individually arranged side-by-side at the surface of the upper pole shoe, and having deflection optics, that deflects light rays emerging from a second end of the lightguide arrangement downwardly in a vertical direction, optically coupled to the second end of the lightguide arrangement, opposite the light source. The illumination means makes the high luminance required for surgical procedures available but the structural height of the examination space is not significantly reduced due to the presence of the illumination means. Further, the illumination means avoids ferromagnetic and conductive structures inside the examination space, so that magnetic resonance examinations are not negatively affected.

In an embodiment the light source is formed by a substantially punctiform light source and a parabolic mirror in whose focal spot the light source is arranged. The light emitted toward the back of the light source can thus also be supplied into the lightguide arrangement.

In another embodiment, the deflection optics include a mirror that having a reflective surface. The mirror, which is preferably formed by a metallized surface, reflects the light rays emerging at the lightguide arrangement substantially completely, and magnetic resonance examinations are not negatively affected.

For displacing the illuminated field, the deflection optics is movable arranged on the surface of the pole shoe according to another embodiment.

DESCRIPTION OF THE PREFERRED EMBODIMENTS

Figure 1:
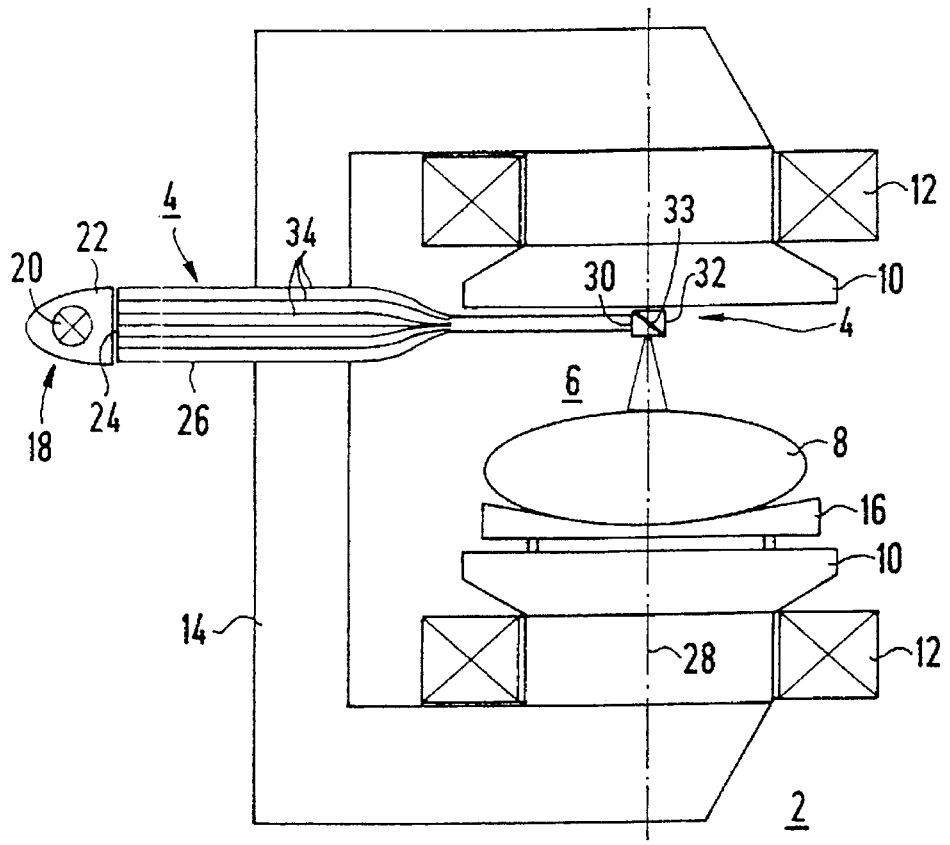
FIG. 1 is a schematic side view of a magnetic resonance apparatus having operating field illumination means constructed in accordance with the principles of the present invention.

FIG. 1 schematically shows only those parts of a magnetic resonance apparatus 2 that are necessary for explaining an embodiment of an inventive illumination system 4. The magnetic resonance apparatus 2 includes an examination space 6 that can accept at least a part of a patient 8. The examination space 6 is between two pole shoes 10 disposed vertically spaced from and opposite one another, each pole shoe 10 being magnetically coupled to the winding of upper and lower electromagnets 12. The pole shoes 10 homogenize the vertical magnetic field generated by the electromagnets 12 in the examination space 6. Permanent magnets can alternatively be provided instead of the electromagnets 12 shown in FIG. 1 for generating the main magnetic field. The required magnetic return ensues via a C-shaped yoke 14.

The patient 8, or the region of the patient 8 to be examined, is moved into the center of the uniform magnetic field with the assistance of a portable patient bed 16.

As a light source arrangement 18, the illumination system 4 has a punctiform light source 20, for example a halogen lamp, that is located in the focal spot of a parabolic mirror 22 that also forms a component of the light source arrangement 18. A first end 24 of a lightguide arrangement 26 is optically coupled to the light source 20 and to the parabolic mirror 22. As a result of the parabolic mirror 22, the light source arrangement 18 generates a parallel light beam that is supplied into the first end 24. The lightguide arrangement 26 is conducted up to a symmetry line 28 of the examination space 6 and has a second end 30 optically coupled at that location to deflection optics 32.

The lightguide arrangement 26 has individual optical fibers 34 that are bundled at a first end 24 to form a circular light entry face. For example, fifty optical fibers 34 may be bundled, with the individual optical fibers 34 each having a diameter of 1.5 mm.

Since the light intensity in the parabolic mirror 22 decreases greatly with increasing distance from its symmetry line after a limit, the diameter of the light entry face is only so large that the fibers 34 at the circumference of the lightguide arrangement 26 can still pick up and conduct noteworthy quantities of light.

The bundle of optical fibers 34 is spliced open such in the region of the upper pole shoe 10 so that the individual optical fibers 34 are arranged parallel to each other side-by-side. The space required between the pole shoes 10 is thus only insignificantly diminished.

The deflection optics 32 is formed by a mirror 33 that is aligned such that the light rays emerging at the second end 30 are deflected vertically downwardly, and symmetrically relative to the symmetry line 28. The field of illumination of the illumination system 4 thus lies nearly in the center of the examination space 6. The mirror 33 is composed of a smooth, metallized surface.

The light rays emerge at the second end 30 of the lightguide arrangement 26 not only parallel but up to a limit angle. As a result the light rays diverge slightly and generate an elongated illumination field 36 (shown in FIG. 2).

Figure 2:
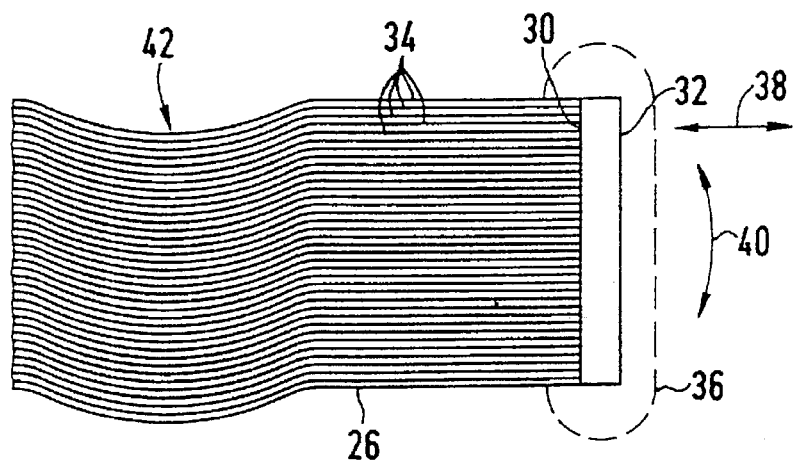
FIG. 2 is a plan view onto the deflection optics belonging to the operating field illumination means.

In a plan view, FIG. 2 shows the second end 30 of the lightguide arrangement 26 with the optically coupled deflection optics 32 (the upper pole shoe 10 not being shown for clarity). The end 30 with the deflection optics 32 can be firmly glued to the surface of the pole shoe 10; however, it can also be arranged movable in a guide, this being symbolized by the double arrow 38 for the longitudinal direction and by the double arrow 40 for the transverse direction. The lightguide arrangement must have loops 42 providing excess length to permit adjustability in the longitudinal direction.

In a further embodiment of the deflection optics 32 (not shown in the drawings), a number of prisms are provided with each prism individually allocated to each optical fiber 34. In terms of effect, this embodiment is equivalent to the embodiment with a mirror 33 already described with reference to FIG. 1.

Although modifications and changes may be suggested by those skilled in the art, it is the intention of the inventor to embody within the patent warranted hereon all changes and modifications as reasonably and properly come within the scope of his contribution to the art.

I claim as my invention:

1. In a magnetic resonance imaging apparatus having an upper pole shoe and a lower pole shoe disposed and vertically spaced from and opposite each other and defining an examination space therebetween, said examination space having a symmetry line, the improvement of illumination means for illuminating at least a portion of said examination space, said illumination means comprising:

a light source arrangement disposed outside of said examination space;

a light guide having a first end optically coupled to said light source arrangement and extending into said examination space between said pole shoes and having a second end terminating said light guide at said symmetry line;

said light guide having a plurality of optical fibers disposed side-by-side exclusively in a single plane disposed in said examination space with each of said optical fibers adjacent a surface of the upper pole shoe; and optical deflection means disposed at said second end of said light guide in said examination space for deflecting light emerging from said second end of said light guide vertically downwardly.

2. The improvement of an illumination means as claimed in claim 1 wherein said light source arrangement comprises a substantially punctiform light source and a parabolic mirror having a focal spot, said substantially punctiform light source being disposed at said focal spot of said parabolic mirror.

3. The improvement of an illumination means as claimed in claim 1 wherein said optical deflection means comprises a mirror.

4. The improvement of an illumination means as claimed in claim 3 wherein said mirror comprises a metallized, reflective surface.

5. The improvement of an illumination means as claimed in claim 1 wherein said optical deflection means comprises a plurality of prisms respectively individually allocated to said optical fibers in said plurality of optical fibers.

6. The improvement of an illumination means as claimed in claim 1 wherein said optical deflection means comprises a deflection surface and means for moving said deflection surface relative to said surface of said upper pole shoe.

* * * * *